US 9,055,685 B2

(12) United States Patent
Kurashina et al.

(10) Patent No.: US 9,055,685 B2
(45) Date of Patent: Jun. 9, 2015

(54) ELECTRIC CIRCUIT APPARATUS AND MANUFACTURING METHOD THEREFOR

(71) Applicant: Fujitsu Limited, Kawasaki-shi, Kanagawa (JP)

(72) Inventors: Mamoru Kurashina, Atsugi (JP); Daisuke Mizutani, Sagamihara (JP); Taiga Fukumori, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 197 days.

(21) Appl. No.: 13/901,631

(22) Filed: May 24, 2013

(65) Prior Publication Data

US 2014/0022751 A1    Jan. 23, 2014

(30) Foreign Application Priority Data

Jul. 20, 2012  (JP) .................................. 2012-161057

(51) Int. Cl.
| | |
|---|---|
| *H05K 1/14* | (2006.01) |
| *H05K 3/46* | (2006.01) |
| *H05K 1/02* | (2006.01) |
| *H05K 3/34* | (2006.01) |
| H05K 3/36 | (2006.01) |
| H01L 23/00 | (2006.01) |

(52) U.S. Cl.
CPC ........... *H05K 1/144* (2013.01); *Y10T 29/49126* (2013.01); *H05K 1/024* (2013.01); *H05K 1/147* (2013.01); *H05K 3/3436* (2013.01); *H05K 3/363* (2013.01); *H05K 2201/0154* (2013.01); *H05K 2201/042* (2013.01); *H05K 2201/09063* (2013.01); *H05K 2201/10734* (2013.01); *H05K 2201/2009* (2013.01); *H05K 3/4697* (2013.01); *H01L 24/14* (2013.01); *H01L 24/17* (2013.01)

(58) Field of Classification Search
CPC ..... H05K 1/144; H05K 1/024; H05K 3/3436; H05K 3/4697
USPC .............................. 361/783; 174/260; 29/830
See application file for complete search history.

(56) References Cited

U.S. PATENT DOCUMENTS

| | | | | |
|---|---|---|---|---|
| 5,749,458 A | * | 5/1998 | Bianca et al. .................. | 200/541 |
| 6,183,283 B1 | * | 2/2001 | Kurotori et al. ............... | 439/326 |

(Continued)

FOREIGN PATENT DOCUMENTS

JP         2011-103441 A1     5/2011

*Primary Examiner* — Timothy Thompson
*Assistant Examiner* — Charles Pizzuto
(74) *Attorney, Agent, or Firm* — Kratz, Quintos & Hanson, LLP

(57) ABSTRACT

An electric circuit apparatus includes: a first-circuit board that includes a first-through-hole, and a first-electrode disposed on a front side of the first-circuit-board; a second-circuit-board that is disposed on a back side of the first-circuit-board, the second-circuit-board including on the front side of the second-circuit-board a second-electrode associated with the first-through-hole; a semiconductor device that is disposed on the front side of the first-circuit-board, the semiconductor device including on a back side a third-electrode-associated with the first-electrode, and a fourth-electrode-associated with the second-electrode; a first-bonding-material that bonds the first-electrode and the-third-electrode; a second-bonding-material that bonds the second-electrode and the fourth-electrode while passing through the first-through-hole; and a support body that is disposed between the first-electrode and the second-circuit-board and that supports the first-circuit-board.

10 Claims, 9 Drawing Sheets

(56) References Cited

U.S. PATENT DOCUMENTS

| | | | |
|---|---|---|---|
| 6,200,156 B1 * | 3/2001 | Hiraki et al. | 439/395 |
| 7,794,267 B2 * | 9/2010 | Daily | 439/409 |
| 2006/0148300 A1 * | 7/2006 | Huang et al. | 439/353 |
| 2011/0084383 A1 * | 4/2011 | Mizutani | 257/737 |

* cited by examiner

ELECTRIC CIRCUIT APPARATUS AND MANUFACTURING METHOD THEREFOR

CROSS-REFERENCE TO RELATED APPLICATION

This application is based upon and claims the benefit of priority of the prior Japanese Patent Application No. 2012-161057, filed on Jul. 20, 2012, the entire contents of which are incorporated herein by reference.

FIELD

The embodiment discussed herein is related to an electric circuit apparatus and a manufacturing method therefor.

BACKGROUND

An electronic apparatus is a device including a circuit substrate having signal lines and a plurality of semiconductor packages mounted on the circuit substrate. Signals propagating through the signal lines formed in the circuit substrate are input into and output from the semiconductor packages.

The circuit substrate is a board including glass cloth and a thermosetting resin impregnated into the glass cloth. The permittivity of glass cloth is not constant, and varies in the circuit substrate. Accordingly, when a signal propagates through a signal line, the permittivity is changed depending on the position of the signal line in the circuit substrate.

An electronic apparatus in which variations in the signal propagation time are reduced by providing signal lines in a polyimide film and by allowing signals to be transmitted through the signal lines has been proposed.

A polyimide film is a flexible insulating film. A polyimide film in which signal lines are provided (hereinafter referred to as a "flexible circuit substrate") is disposed between a semiconductor package and a circuit substrate.

An example of the above-described related art is disclosed in Japanese Laid-open Patent Publication No. 2011-103441.

In the above-described electronic apparatus, through-holes are formed in the flexible circuit substrate, and electrodes of a semiconductor package and electrodes of a circuit substrate (for example, a printed wiring board) are connected to each other via bumps which pass through the through-holes. Then, by using these bumps, the flexible circuit substrate is fixed to the circuit substrate.

However, before the flexible circuit substrate is fixed by using the bumps, it is likely that the flexible circuit substrate will be tilted or displaced if a slight force is applied or the flexible circuit substrate is thermally expanded during a reflowing process.

If the flexible circuit substrate is tilted, a connection fault may occur in bumps which connect the flexible circuit substrate and the semiconductor packages. If the flexible circuit substrate is displaced, a connection fault may occur in bumps which connect the flexible circuit substrate and the circuit substrate.

SUMMARY

According to an aspect of the invention, An electric circuit apparatus includes: a first-circuit board that includes a first-through-hole, and a first-electrode disposed on a front side of the first-circuit-board; a second-circuit-board that is disposed on a back side of the first-circuit-board, the second-circuit-board including on the front side of the second-circuit-board a second-electrode associated with the first-through-hole; a semiconductor device that is disposed on the front side of the first-circuit-board, the semiconductor device including on a back side a third-electrode-associated with the first-electrode, and a fourth-electrode-associated with the second-electrode; a first-bonding-material that bonds the first-electrode and the-third-electrode; a second-bonding-material that bonds the second-electrode and the fourth-electrode while passing through the first-through-hole; and a support body that is disposed between the first-electrode and the second-circuit-board and that supports the first-circuit-board.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Figure 1:
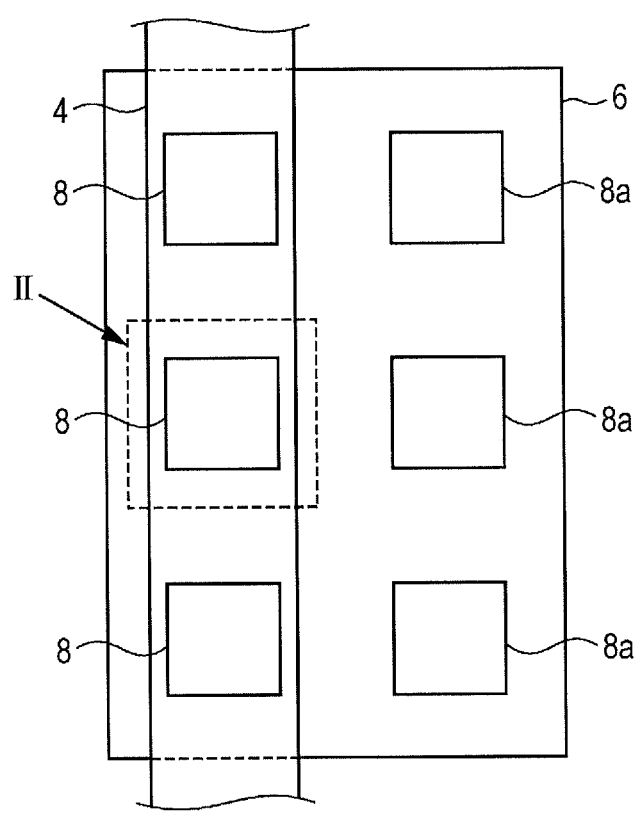
FIG. 1 is a plan view illustrating an example of an electric circuit apparatus of an embodiment.

An embodiment will be described below with reference to the accompanying drawings. In the drawings, the same elements are designated by like reference numerals, and an explanation thereof will be given only once.

(1) Structure

FIG. 1 is a plan view illustrating an electric circuit apparatus 2 of this embodiment.

As illustrated in FIG. 1, the electric circuit apparatus 2 includes a first circuit board 4, a second circuit board 6, and semiconductor devices 8.

The first circuit board 4 is, for example, a flexible printed circuit board. In the example illustrated in FIG. 1, the plurality of semiconductor devices 8 are mounted on the first circuit board 4. However, only one semiconductor device 8 may be mounted on the first circuit board 4.

The first circuit board 4 may extend to and be connected to a circuit board which is different from the second circuit board 6. Connectors may be connected to ends of the first circuit board 4, or no elements may be connected to the ends of the first circuit board 4.

The second circuit board 6 is a circuit board (for example, a printed wiring board) including, for example, glass cloth and a resin (for example, an epoxy resin or a polyimide resin) impregnated into the glass cloth. The second circuit board 6 is, for example, a motherboard or a system board.

In the example illustrated in FIG. 1, the semiconductor devices 8 are mounted on the first circuit board 4, and at the same time, semiconductor devices 8a are also mounted on the second circuit board 6. However, the semiconductor devices 8a may not mounted on the second circuit board 6.

Figure 2:
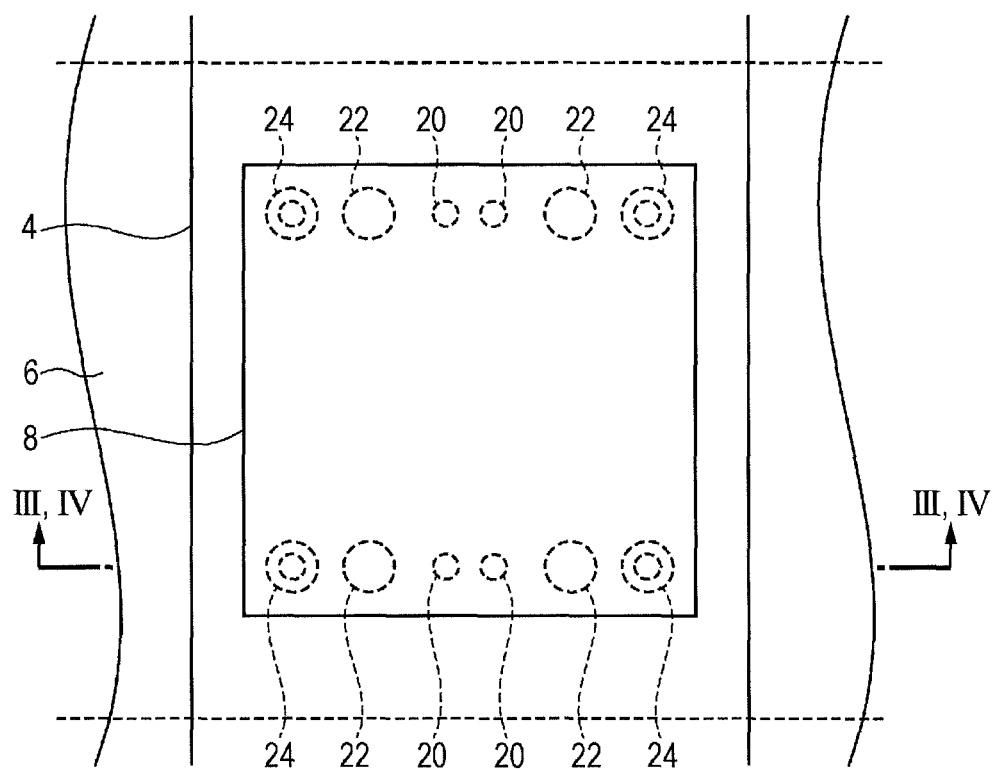
FIG. 2 is an enlarged view illustrating a region surrounded by the broken lines in FIG. 1.
Figure 3:
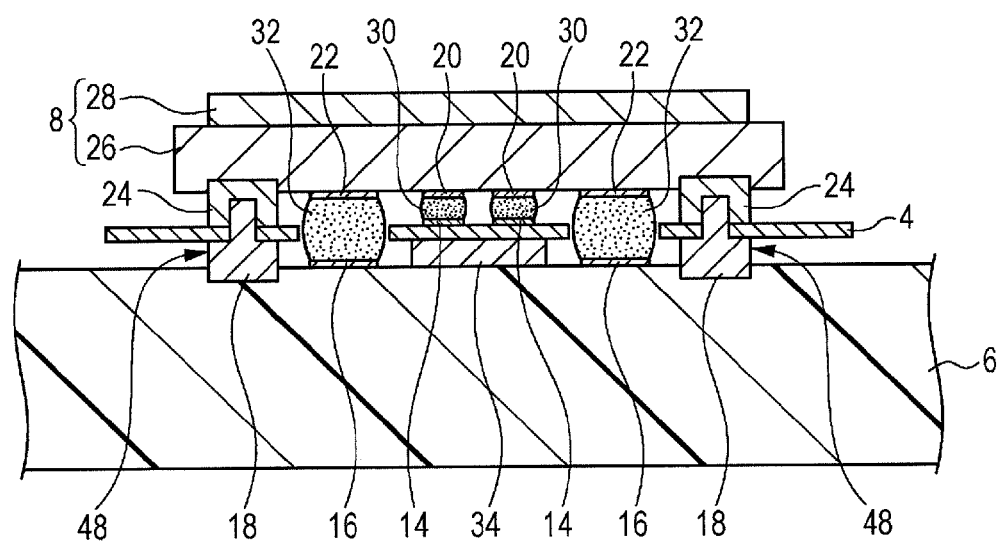
FIG. 3 is a sectional view taken along line of FIG. 2.
Figure 4:
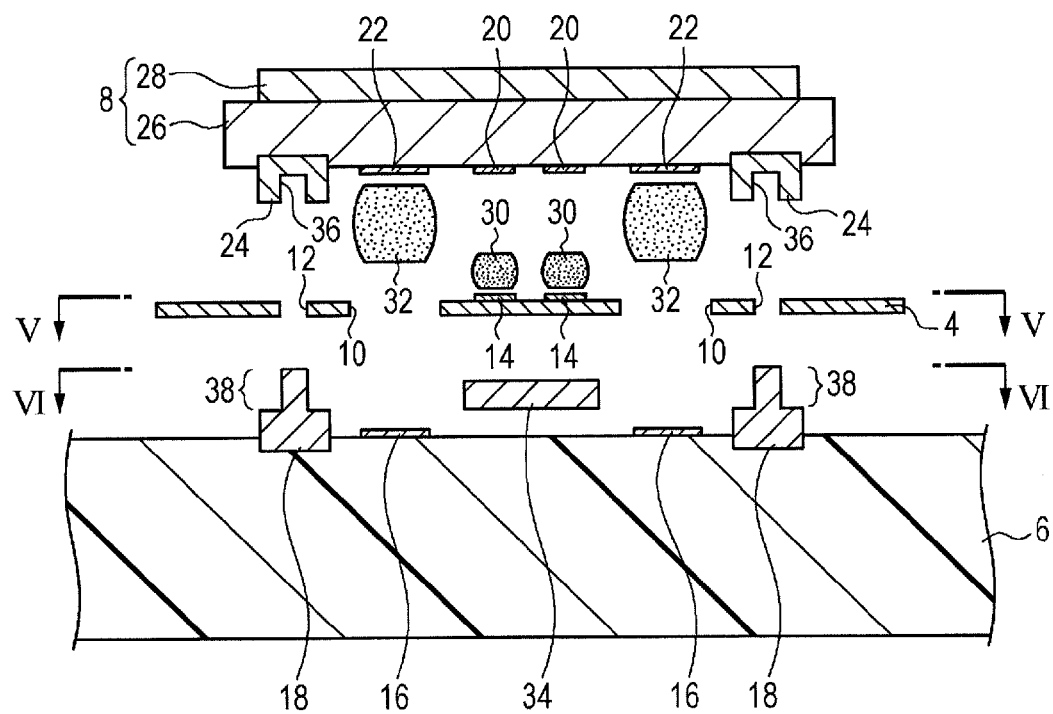
FIG. 4 is an exploded view illustrating a section taken along line IV-IV of FIG. 2.

FIG. 2 is an enlarged view illustrating a region indicated by II surrounded by the broken lines in FIG. 1. In FIG. 2, the structure of the back side of the semiconductor device 8 is illustrated by using the broken lines. FIG. 3 is a sectional view taken along line III-III of FIG. 2. FIG. 4 is an exploded view illustrating a section taken along line IV-IV of FIG. 2.

As illustrated in FIGS. 3 and 4, the second circuit board 6 is disposed below the back side of the first circuit board 4. The semiconductor device 8 is disposed above the front side of the first circuit board 4.

Figure 5:
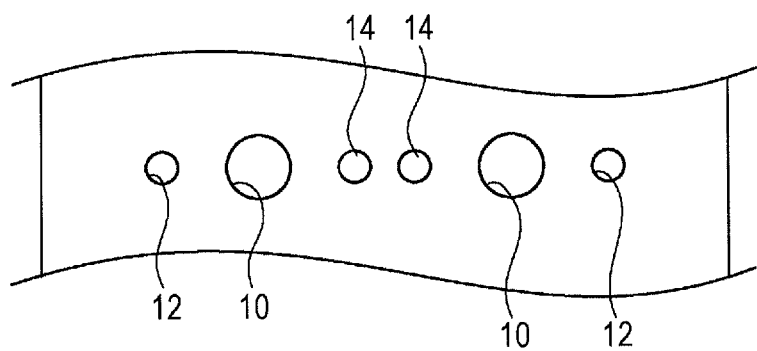
FIG. 5 is a partial plan view illustrating a first circuit board taken along line V-V of FIG. 4.

FIG. 5 is a partial plan view illustrating the first circuit board 4 taken along line V-V of FIG. 4. As illustrated in FIGS. 4 and 5, first through-holes 10 and second through-holes 12 are provided in the first circuit board 4. First electrodes 14 are also formed on the front side of the first circuit board 4.

Figure 6:
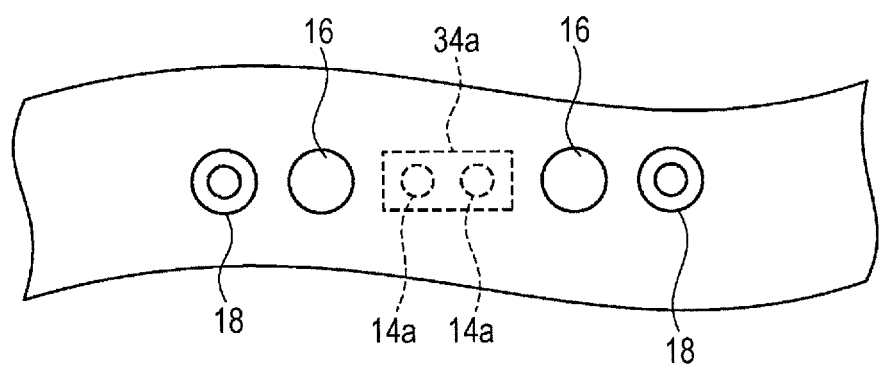
FIG. 6 is a partial plan view illustrating a second circuit board taken along line VI-VI of FIG. 4.

FIG. 6 is a partial plan view illustrating the second circuit board 6 taken along line VI-VI of FIG. 4. As illustrated in FIGS. 4 and 6, the second circuit board 6 includes second electrodes 16 associated with the first through-holes 10 and first projections 18 associated with the second through-holes 12 and projecting from the front side of the second circuit board 6.

In FIG. 6, regions 14a associated with the first electrodes 14 and a region 34a associated with a support body 34 are indicated by the broken lines. The first electrodes 14 are disposed above the regions 14a, and the support body 34 is disposed above the region 34a. Details of the support body 34 will be discussed later.

As illustrated in FIG. 3, the semiconductor device 8 includes a package board 26 and a semiconductor chip (semiconductor element) 28 mounted on the front side of the package board 26. In the semiconductor chip 28, an integrated circuit is formed.

As illustrated in FIGS. 2 and 4, the semiconductor device 8 also includes third electrodes 20 associated with the first electrodes 14 and fourth electrodes 22 associated with the second electrodes 16. As illustrated in FIG. 4, the semiconductor device 8 also includes second projections 24 associated with the second through-holes 12 and projecting from the back side of the semiconductor device 8 (more specifically, the back side of the package board 26).

The third and fourth electrodes 20 and 22 are connected to the semiconductor chip 28 with the package board 26 therebetween. The package board 26 is, for example, a build-up board. As illustrated in FIG. 2, the second projections 24 are formed, for example, at four corners of the semiconductor device 8.

As illustrated in FIG. 3, the electric circuit apparatus 2 also includes first bonding materials 30 that bond the first electrodes 14 and the third electrodes 20 and second bonding materials 32 that bond the second electrodes 16 and the fourth electrodes 22 while passing through the first through-holes 10 (see FIG. 4). The first and second bonding materials 30 and 32 are, for example, solder (for example, AgSn solder).

As illustrated in FIGS. 3 and 4, the electric circuit apparatus 2 also includes the above-described support body 34. The support body 34 is disposed between the first electrodes 14 and the second circuit board 6 and supports the first circuit board 4. The support body 34 is, for example, a resin plate. The support body 34 is bonded (fixed) to the back side of the first circuit board 4 or the front side of the second circuit board 6 with an adhesive material. The support body 34 may be a metallic (for example, stainless) plate.

As illustrated in FIG. 4, the second projections 24 each include a recess 36 associated with the second through-hole 12 formed in the first circuit board 4. As illustrated in FIGS. 3 and 4, the first projections 18 each include a protrusion 38 which passes through the through-hole 12 and which is inserted into the recess 36. Alternatively, the first projections 18 may each include the recess 36, and the second projections 24 may each include the protrusion 38.

The first projections 18 are, for example, metallic (for example, stainless) components, and are inserted into, for example, indentations formed on the front side of the second circuit board 6 by using a router. The first projections 18 may be inserted into through-holes which pass through the second circuit board 6, or may be bonded (fixed) to the front side of the second circuit board 6 with an adhesive material.

Similarly, the second projections 24 are, for example, metallic (for example, stainless) components, and are inserted into, for example, indentations formed on the back side of the semiconductor device 8. The second projections 24 may be inserted into through-holes which pass through the package board 26, or may be bonded (fixed) to the back side of the semiconductor device 8 with an adhesive material.

The first and second projections 18 and 24 are made of, for example, a metallic wire rod. The first and second projections 18 and 24 may be made of a resin (for example, an epoxy resin or a polyimide resin).

The diameters of the first and second projections 18 and 24 are, for example, about 5 mm. The diameters of the recesses 36 and the protrusions 38 are, for example, about 3 mm.

Figure 7:
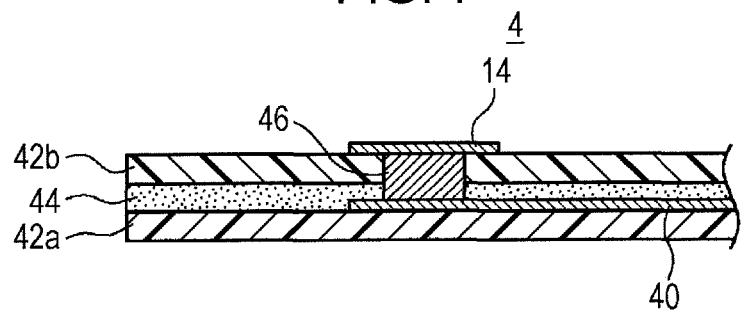
FIG. 7 is a partial sectional view illustrating the first circuit board.

FIG. 7 is a sectional view illustrating the first circuit board 4. As illustrated in FIG. 7, the first circuit board 4 includes a first resin film (for example, a polyimide film) 42a and a second resin film (for example, a polyimide film) 42b. A signal line 40, for example, is disposed on the front side of the first resin film 42a, and the first electrode 14 is disposed on the front side of the second resin film 42b. The first circuit board 4 also includes a bonding layer 44 for bonding the first resin film 42a and the second resin film 42b and a via-hole 46 through which the first electrode 14 is connected to the signal line 40.

A signal output from the semiconductor device 8 (see FIG. 3) is supplied to the signal line (wiring) 40 through the first electrode 14 and the via-hole 46 and propagates through the signal line 40. A signal is also supplied from the signal line 40 to the semiconductor device 8 through the via-hole 46 and the first electrode 14. Signals supplied to and from the semiconductor device 8 may propagate through the same signal line 40 or may through different signal lines 40.

The second circuit board 6 includes glass cloth made of glass fibers interwoven with each other and a thermosetting resin impregnated into the glass cloth. The permittivity of glass cloth is higher than that of a thermosetting resin.

The density of glass fibers forming glass cloth is not uniform. For example, the density of glass fibers in a region in which warp threads and weft threads intersect with each other is higher than that in a region between warp threads. Accordingly, the permittivity within a circuit substrate (in this embodiment, the second circuit board 6) is not uniform and varies. Due to this nonuniform permittivity, the time taken for a signal to propagate through a signal line in the circuit substrate (in this embodiment, the second circuit board 6) is changed depending on the position of the signal line in the second circuit board 6.

In contrast, as illustrated in FIG. 7, the first circuit board 4 does not include glass cloth. Accordingly, if a plurality of signal lines 40 are provided in the first circuit board 4, the speeds of signals propagating through the individual signal lines are substantially constant (however, it is assumed that the signal lines have the same structure).

In the first circuit board 4, therefore, signal lines used for transmitting signals for which, for example, variations (fluctuations) in the propagation speed are not desirable, are disposed. In the first circuit board 4, for example, a pair of signal lines through which differential signals are transmitted (such signal lines will be hereinafter referred to as "differential wirings") is disposed. The phase of a signal transmitted through one differential wiring is opposite to that transmitted through the other differential wiring. As stated above, the propagation speeds of the signal lines 40 are substantially constant, and thus, differential skew (skew of differential signals) does not usually occur.

The second circuit board 6 may be a multilevel interconnection board. In this case, signal lines disposed within the second circuit board 6 are connected to the semiconductor device 8 through a conductive film disposed within via-holes which are in contact with the ends of the signal lines. The conductive film forms a via-hole open stub having opened ends. Accordingly, when a high-frequency signal is supplied from the semiconductor device 8 to the second circuit board 6, reflected waves are generated, thereby distorting the high-frequency signal.

In contrast, as illustrated in FIG. 7, the first circuit board 4 of this embodiment does not include a via-hole open stub. Accordingly, the possibility that reflected waves are generated in a high-frequency signal supplied from the semiconductor device 8 to the first circuit board 4 is reduced. Thus, by the provision of the first circuit board 4, the signal quality (signal integrity) is improved. The frequency of signals supplied to the first circuit board 4 is, for example, 10 to 100 GHz.

In the second circuit board 6, signal lines used for transmitting low-frequency signals (for example, 10 GHz or lower signals) or signals for which, for example, variations (fluctuations) in the propagation speed may be safely ignored, are disposed. Power source lines and ground lines are also disposed in the second circuit board 6.

Figure 8:
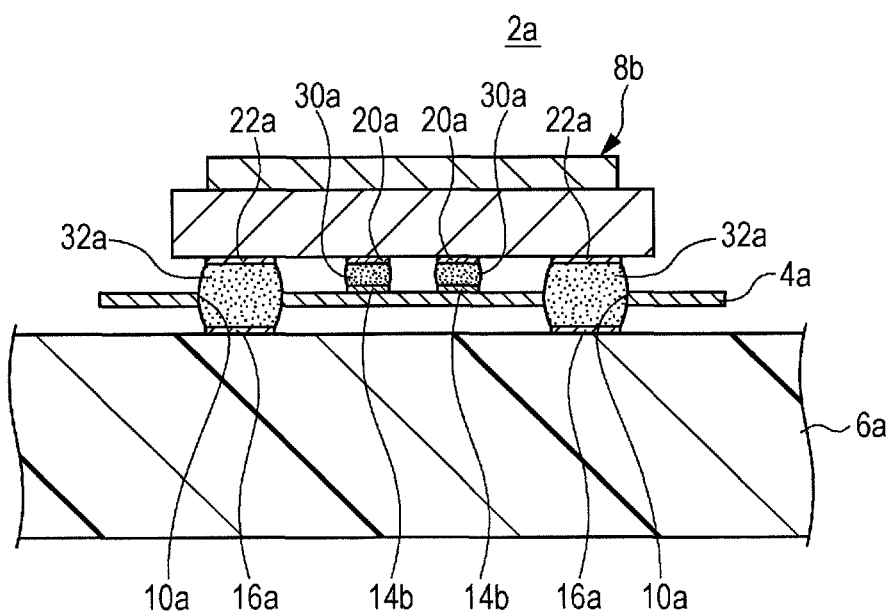
FIG. 8 is a sectional view illustrating an electric circuit apparatus which does not include a support body or projections.

FIG. 8 is a sectional view illustrating an electric circuit apparatus 2a which does not include the support body 34 or the first and second projections 18 and 24.

In the electric circuit apparatus 2a, second electrodes 16a of a second circuit board 6a and fourth electrodes 22a of a semiconductor device 8b are connected to each other by using second bonding materials 32a passing through through-holes 10a formed in a first circuit board 4a. By using the second bonding materials 32a, the first circuit board 4a is fixed to the second circuit board 6a. The second bonding materials 32a are tightly bonded to the walls of the through-holes 10a during a reflowing process, thereby fixing the first circuit board 4a to the second circuit board 6a.

Figure 9:
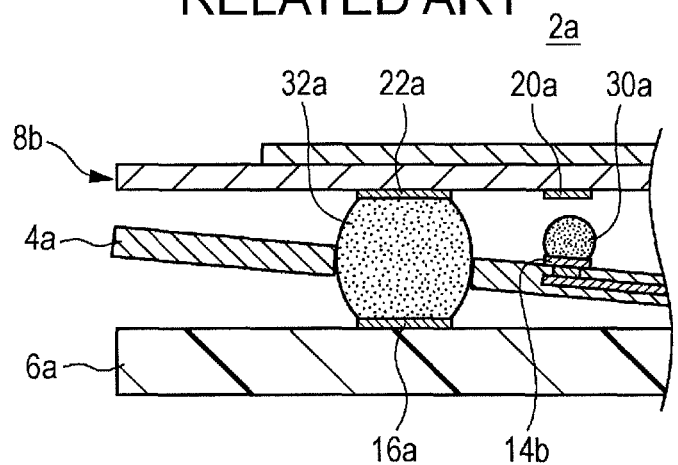
FIG. 9 is a sectional view illustrating a problem of the electric circuit apparatus illustrated in FIG. 8.
Figure 10:
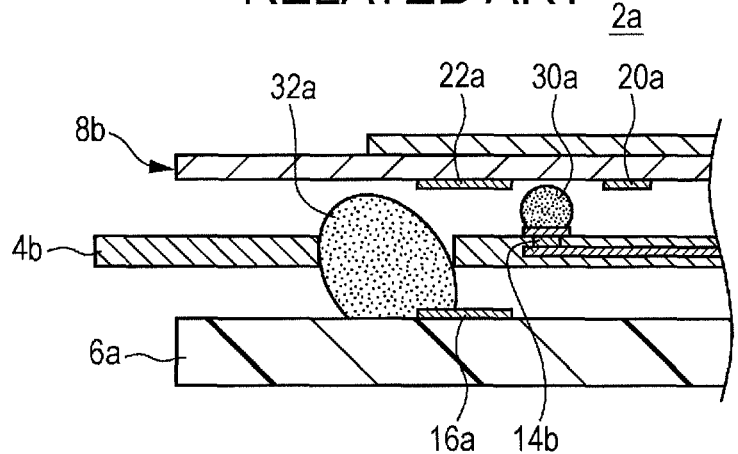
FIG. 10 is a sectional view illustrating a problem of the electric circuit apparatus illustrated in FIG. 8.

FIGS. 9 and 10 are sectional views illustrating problems occurring in the electric circuit apparatus 2a illustrated in FIG. 8.

Before the first circuit board 4a is fixed by using the second bonding materials 32a, as illustrated in FIG. 9, it is likely that the first circuit board 4a will be tilted if a slight force is applied or the first circuit board 4a is thermally expanded during a reflowing process. Additionally, before the first circuit board 4 is fixed by using the second bonding materials 32a, as illustrated in FIG. 10, it is likely that the first circuit board 4a will be displaced if a slight force is applied or the first circuit board 4a is thermally expanded during a reflowing process.

Additionally, the first circuit board 4a positioned under the semiconductor device 8b is easily tilted or displaced, for example, due to a force from an adjacent semiconductor device (not illustrated).

The thermal expansion coefficient of the first circuit board 4a, which is made of polyimide, is smaller than that of the second circuit board 6a including glass cloth, and is greater than that of the semiconductor device 8b (and more specifically, the package board 26). Accordingly, when being heated, for example, during a reflowing process, the first circuit board 4a, the second circuit board 6a, and the semiconductor device 8b expand non-uniformly. As a result, the first circuit board 4a is easily tilted or displaced.

If the first circuit board 4a is tilted, as illustrated in FIG. 9, it is difficult to connect a first electrode 14b of the first circuit board 4a and a third electrode 20a of the semiconductor device 8b by using a first bonding material 30a.

If the first circuit board 4a is displaced, as illustrated in FIG. 10, it is difficult to connect the second electrode 16a of the second circuit board 6a and the fourth electrode 22a of the semiconductor device 8b by using the second bonding material 32a. It is also difficult to connect the first electrode 14b of the first circuit board 4a and the third electrode 20a of the semiconductor device 8b by using the first bonding material 30a. Thus, an electric connection fault is likely to occur in the electric circuit apparatus 2a illustrated in FIG. 8.

In contrast, in the electric circuit apparatus 2 of this embodiment, as illustrated in FIG. 3, since the support body 34 supports the first circuit board 4, the first circuit board 4 is not easily tilted. Moreover, in the electric circuit apparatus 2 of this embodiment, the first circuit board 4 is clamped, around the second through-holes 12 (see FIG. 4), between the first and second projections 18 and 24, and thus, the first circuit board 4 is not easily displaced. Therefore, an electric connection fault is not likely to occur in the electric circuit apparatus 2 of this embodiment.

The spacing between the first circuit board 4 and the second circuit board 6 is, for example, 100 to 500 μm. The spacing between the first circuit board 4 and the semiconductor device 8 is, for example, 100 to 500 μm. The thickness of the first circuit board 4 is, for example, 10 to 100 μm.

Figure 11:
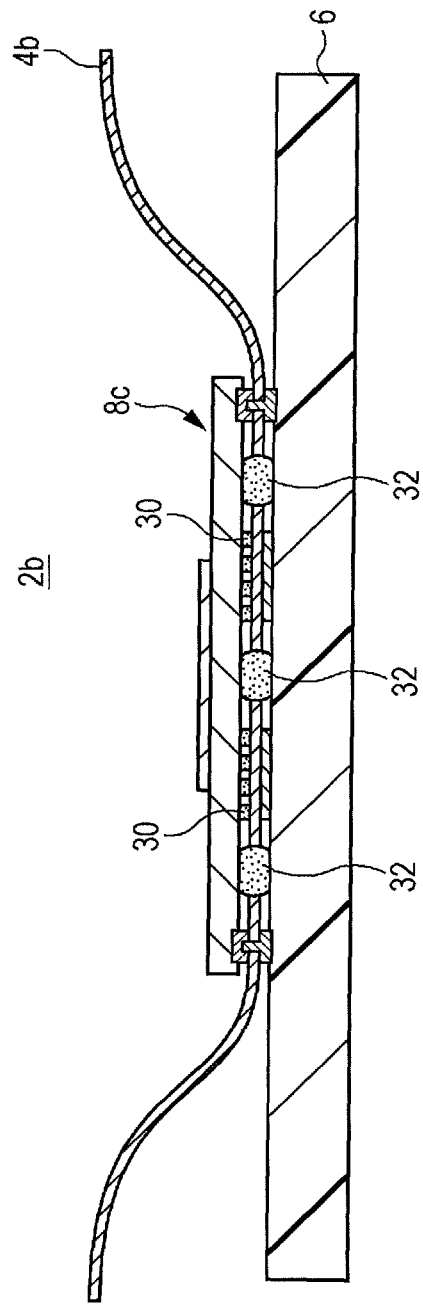
FIG. 11 illustrates another example of an electric circuit apparatus of this embodiment.

FIG. 11 is a sectional view, along the longitudinal direction of a first circuit board 4b, illustrating another example of an electric circuit apparatus 2b of this embodiment. In FIG. 11, the first through fourth electrodes 14, 16, 20, and 22 are not illustrated.

In the electric circuit apparatus 2 illustrated in FIG. 2, the third and fourth electrodes 20 and 22 and the first and second bonding materials 30 and 32 (see FIG. 3) are disposed along the widthwise direction of the first circuit board 4. However, as illustrated in FIG. 11, the third and fourth electrodes 20 and 22 and the first and second bonding materials 30 and 32 may be disposed along the longitudinal direction of the first circuit board 4, or may be disposed in a lattice-like form. Additionally, as illustrated in FIG. 11, in a range outside a semiconductor substrate 8c, the first circuit board 4b may be separated from the second circuit board 6.

The electric circuit apparatus 2 illustrated in FIG. 3 includes the support body 34 and a fixed portion 48 which is formed by fitting the first and second projections 18 and 24 into each other. However, the electric circuit apparatus 2 may include only one of the fixed portion 48 (that is, a combination of the first and second projections 18 and 24) and the support body 34.

(2) Manufacturing Method

Figure 12:
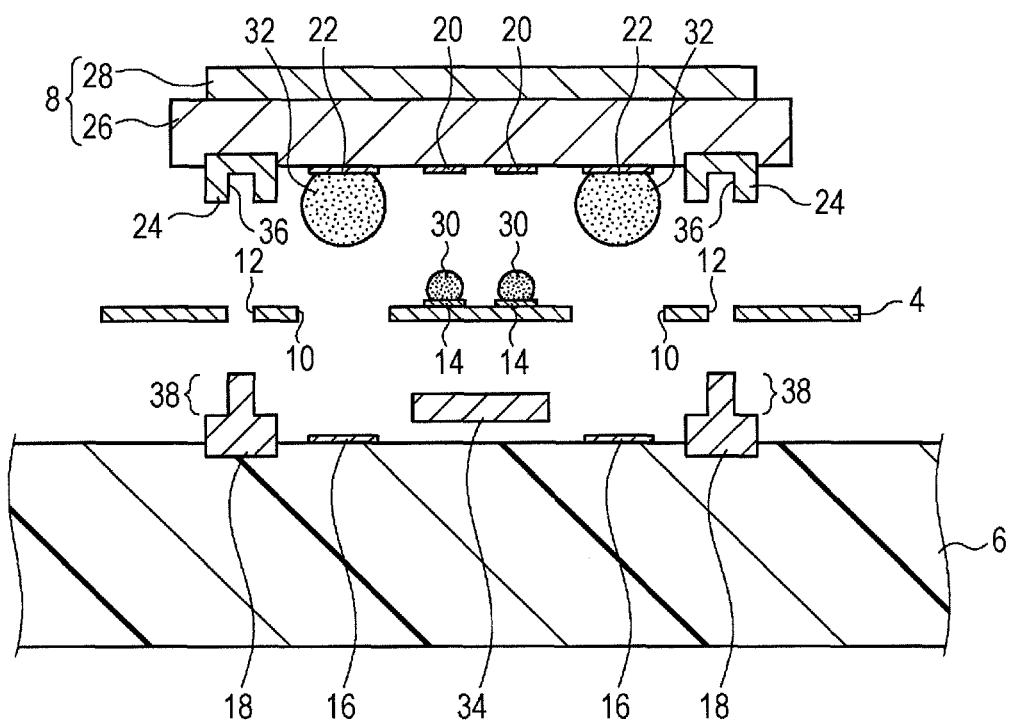
FIG. 12 is a sectional view illustrating components forming an electric circuit apparatus.
Figure 13:
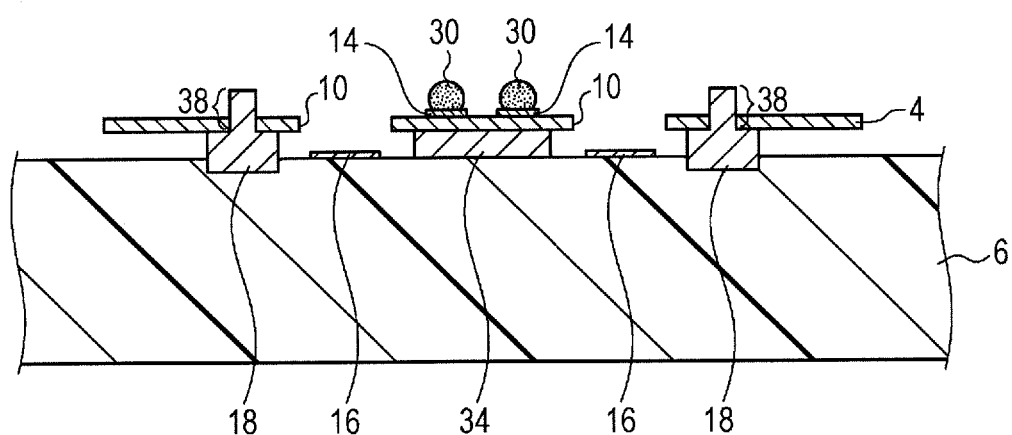
FIG. 13 is a sectional view illustrating a step of a manufacturing method for an electric circuit apparatus.
Figure 14:
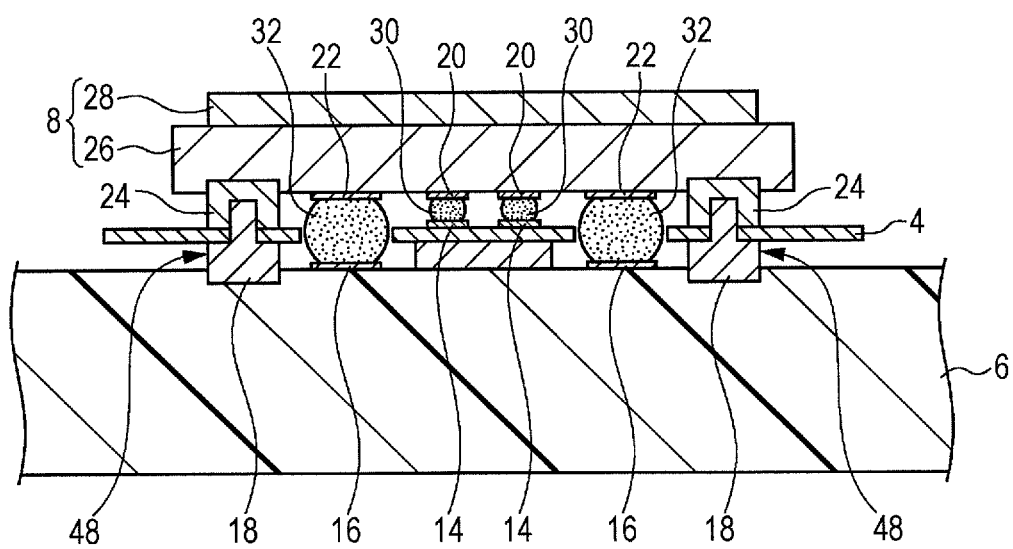
FIG. 14 is a sectional view illustrating a step of a manufacturing method for an electric circuit apparatus.

FIG. 12 is a sectional view illustrating the components forming the electric circuit apparatus 2. FIGS. 13 and 14 are sectional views illustrating steps of a manufacturing method for the electric circuit apparatus 2.

First, as illustrated in FIG. 12, the first circuit board 4, the second circuit board 6, the semiconductor device 8, and the support body 34 for supporting the first circuit board 4 are prepared.

The first circuit board 4 is a board in which the first and second through-holes 10 and 12 are provided and the first electrodes 14 is formed on the front side.

Before performing a step of mounting the semiconductor device 8 (more preferably, a step of mounting a circuit board), which will be discussed later, the first bonding materials 30 are bonded to the first electrodes 14. The first bonding materials 30 may be bonded to the third electrodes 20. The first bonding materials 30 are, for example, soldering bumps.

The second circuit board 6 includes the second electrodes 16 associated with the first through-holes 10 and the first projections 18 associated with the second through-holes 12 and projecting from the front side of the second circuit board 6.

The semiconductor device 8 includes, on the back side, the third electrodes 20 associated with the first electrodes 14 and the fourth electrodes 22 associated with the second electrodes 16, and the semiconductor chip 28 is mounted on the package board 26 of the semiconductor device 8. The semiconductor device 8 also includes, on the back side, the second projections 24 associated with the second through-holes 12 and being fit into the first projections 18.

Before performing the step of mounting the semiconductor device 8, which will be discussed later, the second bonding materials 32 are bonded to the fourth electrodes 22. The second bonding materials 32 may be bonded to the second electrodes 16. The second bonding materials 32 are, for example, soldering bumps.

—Mounting Step of Circuit Board (FIG. 13)—

First, the support body 34 is bonded (fixed) to the back side of the first circuit board 4 with, for example, an adhesive material. As viewed from the first electrodes 14 formed on one side of the first circuit board 4, the support body 34 is bonded (fixed) to the opposite side of the first circuit board 4.

Then, as illustrated in FIG. 13, the second circuit board 6 and the support body 34 are disposed on the back side of the first circuit board 4 such that the second electrodes 16 opposes the first through-holes 10 and such that the support body 34 is interposed between the first electrodes 14 and the second circuit board 6.

At this time, the second circuit board 6 is disposed on the back side of the first circuit board 4 such that the first projections 18 and the second through-holes 12 overlap each other as viewed from above. In the example illustrated in FIG. 12, the second projections 24 include the recesses 36, and the first projections 18 include the protrusions 38 which are fit into the recesses 36. Accordingly, as illustrated in FIG. 13, the protrusions 38 of the first projections 18 pass through the second through-holes 12 (see FIG. 12). Alternatively, the first projections 18 may include the recesses 36, and the second projections 24 may include the protrusions 38 which are fit into the recesses 36.

The support body 34 may be fixed onto the front side of the second circuit board 6. That is, the support body 34 may be fixed onto either of the first circuit board 4 or the second circuit board 6, as long as it is positioned between the first electrodes 14 and the second circuit board 6 when the second circuit board 6 is disposed on the back side of the first circuit board 4, as illustrated in FIG. 13.

According to this step, the first circuit board 4 is supported by the support body 34. Thus, thereafter, it is not likely that the first circuit board 4 will be tilted.

—Mounting Step of Semiconductor Device (FIG. 14)—

Subsequently, the semiconductor device 8 is mounted on the front side of the first circuit board 4 such that the first electrodes 14 and the third electrodes 20 sandwich the first bonding materials 30 therebetween and such that the second electrodes 16 and the fourth electrodes 22 sandwich the second bonding materials 32 therebetween. In this case, the semiconductor device 8 is mounted such that the protrusion 38 of one of the first and second projections 18 and 24 (the first projection 18 in FIG. 14) is inserted into the recess 36 of the other projection (the second projection 24 in FIG. 14).

According to this step, the first circuit board 4 is fixed by the fixed portion 48 formed by fitting the first and second projections 18 and 24 into each other. Thus, thereafter, it is not likely that the first circuit board 4 will be displaced.

—Bonding Step—

Finally, the first bonding materials 30 are heated so that the first electrodes 14 and the third electrodes 20 may be bonded to each other. The second bonding materials 32 are also heated so that the second electrodes 16 and the fourth electrodes 22 may be bonded to each other.

The first and second bonding materials 30 and 32 are heated at the same time by, for example, a reflowing process. As a result, the electric circuit apparatus 2 illustrated in FIG. 3 is fabricated.

In the above-described embodiment, one support body 34 is disposed for the plurality of first electrodes 14. However, one support body 34 may be disposed for each of the first electrodes 14.

In the above-described embodiment, the semiconductor device 8 includes only the semiconductor chip 28 and the package board 26. However, the semiconductor device 8 may also include a heat dispenser, a fin, a sealing resin, and so on.

In the above-described embodiment, the first circuit board 4 is a flexible board. However, the first circuit board 4 may be a non-flexible board (for example, a silicon interposer).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An electric circuit apparatus comprising:
a first circuit board that includes
a first through-hole, and
a first electrode disposed on a front side of the first circuit board;
a second circuit board that is disposed on a back side of the first circuit board, the second circuit board including on the front side of the second circuit board a second electrode associated with the first through-hole;
a semiconductor device that is disposed on the front side of the first circuit board, the semiconductor device including on a back side
a third electrode associated with the first electrode, and
a fourth electrode associated with the second electrode;
a first bonding material that bonds the first electrode and the third electrode;
a second bonding material that bonds the second electrode and the fourth electrode while passing through the first through-hole; and
a support body that is disposed between the first electrode and the second circuit board and that supports the first circuit board.

2. The electric circuit apparatus according to claim 1, wherein:
the first circuit board further includes a second through-hole;
the second circuit board further includes a first projection associated with the second through-hole and projecting from the front side of the second circuit board;
the semiconductor device further includes a second projection associated with the second through-hole and projecting from the back side of the semiconductor device;
one of the first and second projections includes a recess associated with the second through-hole included in the first circuit board; and
the other one of the second and first projections includes a protrusion which passes through the second through-hole and which is fit into the recess.

3. The electric circuit apparatus according to claim 2, wherein the second projection is disposed at each of four corners of the semiconductor device.

4. The electric circuit apparatus according to claim 1, wherein the support body is fixed to one of the first circuit board and the second circuit board.

5. The electric circuit apparatus according to claim 1, wherein the first circuit board is a flexible board.

6. The electric circuit apparatus according to claim 1, wherein the first circuit board includes a signal line through which one or both of a signal supplied from the semiconductor device via the first electrode and a signal supplied to the semiconductor device via the first electrode propagate.

7. An electric circuit apparatus comprising:
a first circuit board that includes
a first through-hole,
a second through-hole, and
a first electrode on a front side of the first circuit board;
a second circuit board that is disposed on a back side of the first circuit board, the second circuit board including
a second electrode associated with the first through-hole, and
a first projection associated with the second through-hole and projecting from a front side of the second circuit board;
a semiconductor device that is disposed on the front side of the first circuit board, the semiconductor device including
a third electrode associated with the first electrode,
a fourth electrode associated with the second electrode, and
a second projection associated with the second through-hole and projecting from a back side of the semiconductor device;
a first bonding material that bonds the first electrode and the third electrode; and
a second bonding material that bonds the second electrode and the fourth electrode while passing through the first through-hole; wherein:
one of the first and second projections includes a recess associated with the second through-hole included in the first circuit board; and
the other one of the second and first projections includes a protrusion which passes through the second through-hole and which is fit into the recess.

8. A manufacturing method for an electric circuit apparatus, comprising:
disposing, on a back side of a first circuit board including a first through-hole and a first electrode on a front side of the first circuit board, a second circuit board including a second electrode associated with the first through-hole and a support body that supports the first circuit board, such that the second electrode opposes the first through-hole and such that the support body is interposed between the first electrode and the second circuit board;
disposing, on the front side of the first circuit board, a semiconductor device including a third electrode associated with the first electrode, a fourth electrode associated with the second electrode on a back side of the semiconductor device, such that the first electrode and the third electrode sandwich a first bonding material and such that the second electrode and the fourth electrode sandwich a second bonding material; and
bonding the first electrode and the third electrode by heating the first bonding material and bonding the second electrode and the fourth electrode by heating the second bonding material.

9. The manufacturing method according to claim 8, wherein:
in the disposing of the second circuit board and the support body, after the support body is fixed to the back side of the first circuit board or to a front side of the second circuit board, the second circuit board and the support body are disposed on the back side of the first circuit board;
the first bonding material is bonded to the first electrode or the third electrode before the disposing of the semiconductor device; and
the second bonding material is bonded to the second electrode or the fourth electrode before the disposing of the semiconductor device.

10. The manufacturing method according to claim 8, wherein:
the first circuit board further includes a second through-hole;
the second circuit board further includes a first projection associated with the second through-hole and projecting from the front side of the second circuit board;
the semiconductor device further includes a second projection associated with the second through-hole and being fit into the first projection;
in the disposing of the second circuit board and the support body, the second circuit board is disposed on the back side of the first circuit board such that the first projection and the second through-hole overlap each other as viewed from above; and
in the disposing of the semiconductor device, the semiconductor device is disposed on the front side of the first circuit board such that the first projection and the second projection are fit into each other.

* * * * *